(12) United States Patent
Lee et al.

(10) Patent No.: US 7,812,375 B2
(45) Date of Patent: Oct. 12, 2010

(54) NON-VOLATILE MEMORY DEVICE AND METHOD OF FABRICATING THE SAME

(75) Inventors: Chang-Hyun Lee, Suwon-si (KR);
Tea-Kwang Yu, Suwon-si (KR);
Jong-Sun Sel, Yongin-si (KR);
Ju-Hyung Kim, Seongnam-si (KR);
Byeong-In Choe, Yongin-si (KR)

(73) Assignee: Samsung Electronics Co., Ltd.,
Suwon-Si, Gyeonggi-Do (KR)

( * ) Notice: Subject to any disclaimer, the term of this patent is extended or adjusted under 35 U.S.C. 154(b) by 64 days.

(21) Appl. No.: 11/734,659

(22) Filed: Apr. 12, 2007

(65) Prior Publication Data
US 2007/0272971 A1 Nov. 29, 2007

Related U.S. Application Data

(60) Continuation-in-part of application No. 11/149,396, filed on Jun. 9, 2005, now Pat. No. 7,342,280, which is a division of application No. 10/446,970, filed on May 28, 2003, now Pat. No. 6,913,969.

(30) Foreign Application Priority Data

May 23, 2006 (KR) ..................... 10-2006-0046287
Dec. 19, 2006 (KR) ..................... 10-2006-0130382

(51) Int. Cl.
*H01L 31/112* (2006.01)
*H01L 21/336* (2006.01)
(52) U.S. Cl. ................. 257/208; 257/209; 257/390; 438/287
(58) Field of Classification Search ............ 257/208, 257/209, 390, E29.309; 438/287; 365/230.06, 365/201
See application file for complete search history.

(56) References Cited

U.S. PATENT DOCUMENTS 6,323,107 B1  11/2001  Ueda et al.

(Continued)

FOREIGN PATENT DOCUMENTS

JP         4335578         11/1992

(Continued)

OTHER PUBLICATIONS

English Abstract for Publication No. 102002008854.

(Continued)

*Primary Examiner*—Howard Weiss
*Assistant Examiner*—Steven H Rao
(74) *Attorney, Agent, or Firm*—F. Chau & Associates, LLC

(57) ABSTRACT

In the non-volatile memory device, a first isolation layer is formed to have a plurality of depressions each having a predetermined depth from an upper surface of the semiconductor substrate. A fin type first active region is defined by the first isolation layer and has one or more inflected portions at its sidewalls exposed from the first isolation layer, where the first active region is divided into an upper part and a lower part by the inflected portions and a width of the upper part is narrower than that of the lower part. A tunneling insulation layer is formed on the first active region. A storage node layer is formed on the tunneling insulation layer. Also, a blocking insulation layer is formed on the storage node layer, and a control gate electrode is formed on the blocking insulation layer.

19 Claims, 7 Drawing Sheets

U.S. PATENT DOCUMENTS

| | | | |
|---|---|---|---|
| 6,380,583 B1 | 4/2002 | Hsieh et al. | |
| 6,720,611 B2 | 4/2004 | Jang | |
| 6,825,544 B1 | 11/2004 | Jin | |
| 6,849,514 B2 * | 2/2005 | Han | 438/287 |
| 6,927,131 B2 * | 8/2005 | Kim | 438/261 |
| 7,172,938 B2 * | 2/2007 | Choi et al. | 438/257 |
| 7,227,219 B2 | 6/2007 | Mikolajick | |
| 7,227,220 B2 * | 6/2007 | Kim et al. | 257/324 |
| 7,335,560 B2 * | 2/2008 | Kim | 438/261 |
| 7,408,806 B2 * | 8/2008 | Park et al. | 365/185.17 |
| 2002/0001916 A1 | 1/2002 | Chen et al. | |
| 2002/0162571 A1 | 11/2002 | Su et al. | |
| 2002/0187616 A1 | 12/2002 | Lai et al. | |
| 2002/0197821 A1 | 12/2002 | Liu | |
| 2003/0098492 A1 | 5/2003 | Singh et al. | |
| 2004/0072451 A1 | 4/2004 | Choi | |
| 2005/0009290 A1 | 1/2005 | Yan et al. | |
| 2005/0012142 A1 | 1/2005 | Hazama et al. | |
| 2006/0038220 A1 | 2/2006 | Kusters et al. | |
| 2006/0141731 A1 | 6/2006 | Kim | |
| 2006/0148197 A1 | 7/2006 | Wu et al. | |
| 2006/0220088 A1 | 10/2006 | Ueno | |
| 2007/0026632 A1 | 2/2007 | Yamamoto | |
| 2007/0042564 A1 | 2/2007 | Yoon | |
| 2007/0148979 A1 | 6/2007 | Lee et al. | |
| 2007/0155128 A1 | 7/2007 | Choi | |
| 2007/0238237 A1 * | 10/2007 | Lee et al. | 438/197 |
| 2007/0287260 A1 | 12/2007 | Wu et al. | |
| 2008/0171416 A1 * | 7/2008 | Fang et al. | 438/257 |
| 2009/0239352 A1 | 9/2009 | Kitagawa et al. | |

FOREIGN PATENT DOCUMENTS

| | | |
|---|---|---|
| JP | 10-022403 | 1/1998 |
| JP | 2000-306991 | 11/2000 |
| JP | 2001-358237 | 12/2001 |
| JP | 2002-100686 | 4/2002 |
| JP | 2003-068894 | 3/2003 |
| JP | 2005-079165 | 3/2005 |
| JP | 2006-013335 | 1/2006 |
| KR | 1020020088554 | 11/2002 |
| KR | 1020020096741 | 12/2002 |
| KR | 1020030055793 | 7/2003 |
| KR | 1020060000481 | 1/2006 |
| KR | 1020060131213 | 12/2006 |

OTHER PUBLICATIONS

English Abstract for Publication No. 1020020096741.
English Abstract for Publication No. 2005-079165.
English Abstract for Publication No. 1020030055793.
English Abstract for Publication No. 1020060000481.
English Abstract for Publication No. JP4335578.
English Abstract for Publication No. 2000-306991.
English Abstract for Publication No. 2003-068894.
English Abstract for Publication No. 2006-013335.
English Abstract for Publication No. 1020060131213.
English Abstract for Publication No. 10-022403, Jan. 1998.
English Abstract for Publication No. 2001-358237, Dec. 2001.
English Abstract for Publication No. 2002-100686, 2002-94.

* cited by examiner

NON-VOLATILE MEMORY DEVICE AND METHOD OF FABRICATING THE SAME

CROSS-REFERENCE TO RELATED APPLICATIONS

This application is a continuation-in-part (CIP) application of U.S. application Ser. No. 11/149,396 filed on Jun. 9, 2005, now U.S. Pat. No. 7,342,280, which is a is a divisional of U.S. application Ser. No. 10/446,970 filed on May 28, 2003, now U.S. Pat. No. 6,913,969, which claims the benefit of Korean Patent Application No. 2002-39836, filed Jul. 9, 2002, the present CIP application further claiming benefit from Korean Patent Application No. 2006-0046287, filed on May 23, 2006 and Korean Patent Application No. 2006-0130382, filed on Dec. 19, 2006 in the Korean Intellectual Property Office (KIPO), each of which are herein incorporated by reference in its entirety.

BACKGROUND OF THE INVENTION

1. Field of the Invention

The present invention relates to a semiconductor device and a method of fabricating the same, and more particularly, to a nonvolatile memory device and a method of fabricating the same.

2. Description of Related Art

A non-volatile memory device typically stores electric charges corresponding to data in a storage node. Non-volatile memory devices may be categorized into EEPROM (electrically erasable programmable read-only memory) devices, flash memory devices, and SONOS (silicon-oxide-nitride-oxide-silicon) memory devices according to the structure or the type of storage node.

A fin-type non-volatile memory device has been introduced so as to improve the characteristics of non-volatile memory devices, for example, to reduce a short-channel effect while increasing operating current. The fin-type non-volatile memory device has a more spacious channel region and a thinner body than a planar-type non-volatile memory device, thereby reducing the short-channel effect while increasing operating current.

The fin-type non-volatile memory device is manufactured using a silicon-on-insulator (SOI) substrate, which increases manufacturing costs. Also, when a fin-type non-volatile memory device is fabricated using a bulk semiconductor substrate, it can be difficult to fabricate different types of structures optimized for a cell region, a peripheral region, and a boundary region, respectively.

Therefore, a need exists for a non-volatile memory device and method of fabricating the same having increased operating speed.

SUMMARY OF THE INVENTION

According to an embodiment of the present invention, a non-volatile memory device comprises a first isolation layer formed with a plurality of depressions in a semiconductor substrate, where the depressions have a predetermined depth from an upper surface of the semiconductor substrate, a fin type first active region defined by the first isolation layer and having one or more inflected portions at its side walls exposed from the first isolation layers where the first active region is divided into an upper portion and a lower portion by the inflected portions and a width of the upper portion is narrower than a width of the lower portion, a tunneling insulation layer formed on the first active region a storage node layer formed on the tunneling insulation layer, a blocking insulation layer formed on the storage node layer and a control gate electrode formed on the blocking insulation layer.

The inflected portion may comprise a convex portion and a concave portion.

The control gate electrode may be formed to encompass the upper portion of the first active regions and not the lower portion of the first active region.

According to an embodiment of the present invention, a non-volatile memory device comprises a semiconductor substrate in which a first region and a second region are defined a first isolation layer formed with a plurality of depressions in the first region of the semiconductor substrate so as to define a fin type first active region, where the depressions have a predetermined depth from an upper surface of the first region, a second isolation layer formed in the second region in order to define a planar type second active region, a tunneling insulation layer formed on the fin type first active region of the semiconductor substrate, a storage node layer formed on the tunneling insulation layer, a blocking insulation layer formed on the storage node layer, and a control gate electrode formed on the blocking insulation layer.

The non-volatile memory device may further comprise a planar type transistor formed in the planar type second active region on the semiconductor substrate.

According to an embodiment of the present invention, a method of fabricating a non-volatile memory device includes providing a semiconductor substrate in which a first region and a second region are defined, forming a first isolation layer with a plurality of depressions in the first region of the semiconductor substrate, wherein the first isolation layer defines a fin type first active region and the depressions of the first isolation layer have a predetermined depth from an upper surface of the first region of the semiconductor substrate, forming a planar type second isolation layer in the second region of the semiconductor substrate, wherein the planar type second isolation layer defines a second active region, forming a tunneling insulation layer on the first active region of the semiconductor substrate, forming a storage node layer on the tunneling insulation layer, forming a blocking insulation layer on the storage node layer, and forming a control gate electrode on the blocking insulation layer.

The method may further include forming a planar type transistor in the second active region of the semiconductor substrate.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Figure 1:
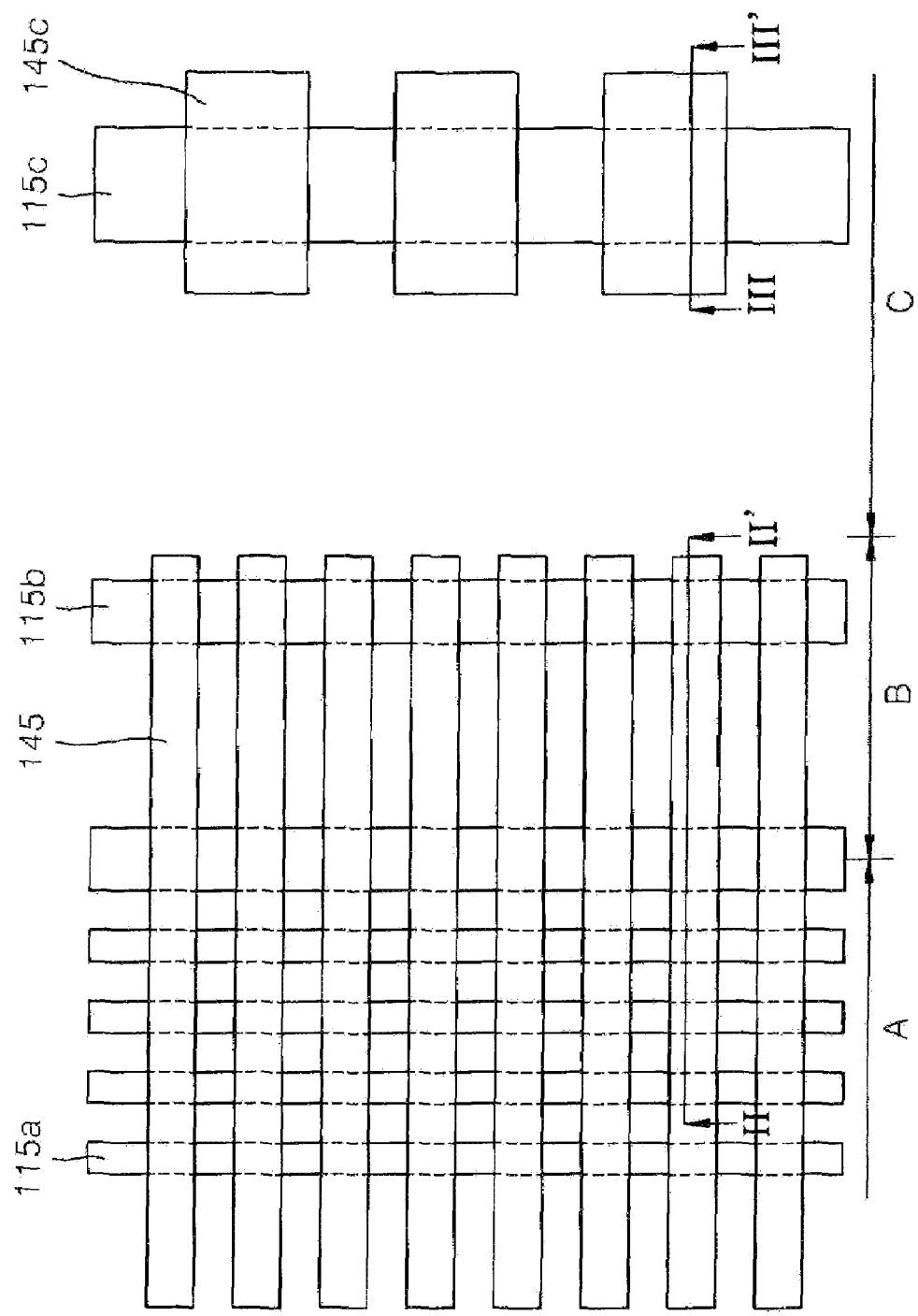
FIG. 1 is a plan view illustrating a non-volatile memory device according to an embodiment of the present invention.

Exemplary embodiments of the present invention will now be described more fully with reference to the accompanying drawings. The present invention may, however, be embodied in many different forms and should not be construed as being limited to embodiments set forth herein. Rather, embodiments are provided so that this disclosure will be thorough and complete and will fully convey the concept of the invention to those skilled in the art. In the drawings, the thickness of layers and regions may be exaggerated for clarity.

Exemplary embodiments of a non-volatile memory device may be variously referred to according to their structures and the types of storage nodes. For example, non-volatile memory devices may be categorized into EEPROM devices, flash memory devices, and SONOS memory devices. The present invention is not limited thereto.

In this disclosure, a fin type structure is presented as an exemplary embodiment for comparisons to a planar type structure. For example, typically, a fin type device uses at least two faces of an active region as channel regions, whereas a planar type device uses a face of an active region as a channel region. That is, a planar type active region is two-dimensional, but a fin type active region may be three-dimensional.

Figure 2:
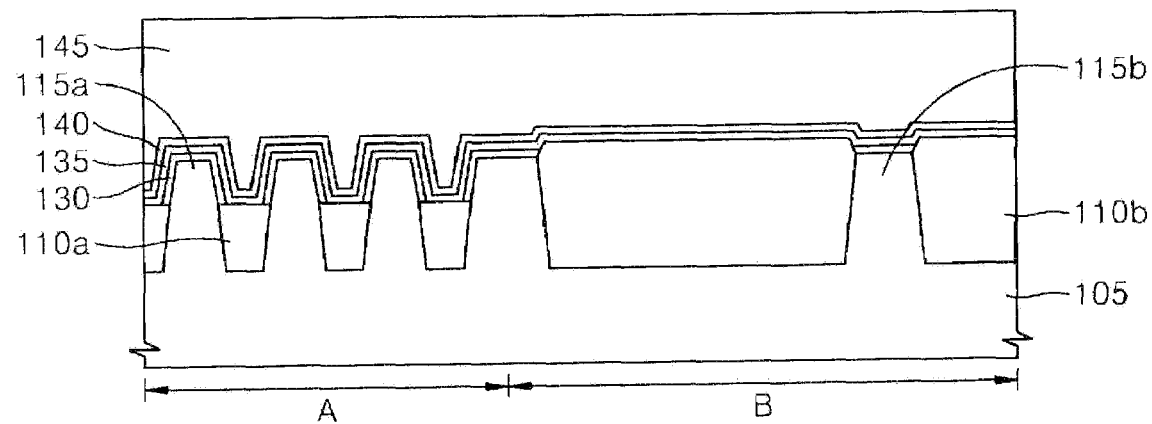
FIG. 2 illustrates a cross-sectional view taken along the line III-III' of the non-volatile memory device in FIG. 1, according to an embodiment of the present invention.
Figure 3:
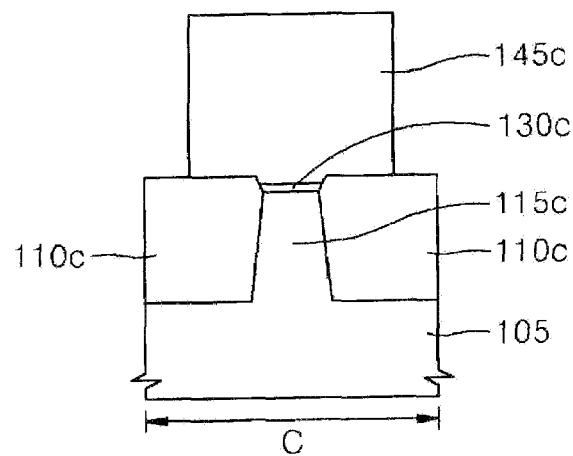
FIG. 3 illustrates a cross-sectional view taken along the line III-III' of the non-volatile memory device in FIG. 1, according to an embodiment of the present invention.

FIG. 1 is a plan view illustrating a non-volatile memory device according to an embodiment of the present invention. FIG. 2 illustrates a cross-sectional view taken along the line II-II of the non-volatile memory device in FIG. 1, according to an embodiment of the present invention. FIG. 3 illustrates a cross-sectional view taken along the line III-III of the non-volatile memory device in FIG. 1, according to an embodiment of the present invention.

Referring to FIGS. 1 through 3, a semiconductor substrate 105 is defined with a plurality of regions A, B, and C. For example, the semiconductor substrate 105 may be divided into a cell region A, a peripheral region C, and a boundary region B between the cell region A and the peripheral region C. In the cell region A, a memory transistor may be formed, and in the peripheral region C, a peripheral circuit device may be formed to control the operation of the memory transistor. In this disclosure, the boundary region B may be used separately from the cell region A and the peripheral region C but shall be understood to include the edges of the cell region A and the peripheral region C. For example, the boundary region B may include a dummy active region that is not related to a memory operation.

The semiconductor substrate 105 may be a bulk semiconductor wafer, such as a silicon wafer, a germanium wafer or a silicon-germanium wafer. The present invention is not limited to the arrangement of the memory transistor in the cell region A. For example, while FIG. 1 illustrates a NAND-type memory transistor as the memory transistor in the cell region A, the memory transistor may be a NOR type.

In embodiments of the present invention, the regions A through C may be divided into groups according to the shape of an isolation layer or the structure of an active region, as will later be described. For example, as illustrated in FIGS. 2 and 3, the cell region A may form a region, and the peripheral region C and the boundary region B may form another region.

According to another embodiment of the present invention, the cell region A may form a region, the peripheral region C may form another region, and the boundary region B may not be present.

In the semiconductor substrate 105, a first region, e.g., the cell region A, may include a first isolation layer 110a, and a second region, e.g., the boundary region B and/or the peripheral region C, may include second isolation layers 110b and 110c. The first isolation layer 110a may have a plurality of depressions, each having a predetermined depth from an upper surface of the semiconductor substrate 105 so as to define a fin-type first active region 115a. The second isolation layers 110b and 110c may be formed to level with or protrude from the upper surface of the semiconductor substrate 105 in order to define planar type second active regions 115b and 115c. FIGS. 2 and 3 illustrate that the first and second isolation layers 110a and 110b are formed to the same depth in the semiconductor substrate 105, but they may be formed to different depths in the semiconductor substrate 105.

The fin type first active region 115a may be three-dimensional since an upper surface and side surfaces of the fin type first active region 115a are exposed via the first isolation layer 110a, and the planar type second active region 115b may be two-dimensional since only an upper surface of the planar type second active region 115b is exposed via the second isolation layers 110b and 110c. The depth of the first isolation layer 110a is a factor that determines the depth of the exposed side surface of the fin type first active region 115a, and thus can be controlled according to desired characteristics of a device. The present invention is not limited to the depth of the first isolation layer 110a.

A tunneling insulation layer 130, a storage node layer 135, a blocking insulation layer 140, and a control gate electrode 145 may be sequentially formed in the cell region A or be formed from the cell region A to the boundary region B in order to define a memory transistor.

For example, the tunneling insulation layer 130 may be formed on the semiconductor substrate 105 in the cell region A while extending to the boundary region B. The tunneling insulation layer 130 may be formed along the exposed surfaces of the fin type first active region 115a, including the upper surfaces and side surfaces of the fin type first active region 115a. The tunneling insulation layer 130 may include, for example, an oxide layer, a nitride layer, or a high-k dielectric layer. According to embodiments of the present invention, the high-k dielectric layer may be a dielectric layer whose dielectric constant is grater than those of the oxide layer and the nitride layer. For example, the high-k dielectric layer may be formed of $Al_2O_3$, $HfO_2$, HfSiO or HfAlO.

The storage node layer 135 may be formed on the tunneling insulation layer 130 while extending to the first and second isolation layers 110a and 110b as illustrated in FIG. 2. The storage node layer 135 may be used as, for example, a medium for storing electric charges and include polysilicon, a silicon nitride layer, metal dots, silicon dots, or a nano-crystal. For example, the nano-crystal may be composed of conductive nanoparticles.

The blocking insulation layer 140 may be formed on the storage node layer 135, and the control gate electrode 145 may be formed on the blocking insulation layer 140 and across the fin type first and planar type second active regions 115a and 115b. For examples the blocking insulation layer 140 may include insulation layers, such as a silicon oxide layer and a high-k dielectric layer. The control gate electrode 145 may include a conductive layer, such as polysilicon, a metal layer, a metal silicide layer, or a composition thereof.

The above memory transistor in the cell region A may be a fin type, and use the fin type first active region 115a and the control gate electrode 145 as a part of a bit line and a part of a word line, respectively. Thus, all the upper and side surfaces and regions near the upper and side surfaces of the fin type first active region 115a can be used as channel regions. Accordingly, the fin-type memory transistor can use a high operating current, and have a thin body structure by controlling the width of the fin type first active region 115a while reducing the short-channel effect. The memory transistor in the cell region A may also have a source/drain structure free from a short channel effect. An exemplary embodiment of the present invention offers a nonvolatile memory device where the source/drain structure may have a PN junction source/drain region that has an impurity layer different from the substrate. Another exemplary embodiment of the present invention offers a nonvolatile memory device where the field effect source/drain structure may be generated when a voltage is applied to the adjacent word line or inversion gate line adjacent thereto. See U.S. patent application Ser. No. 11/643,022, filed on Dec. 20, 2006, the entire contents of which are herein incorporated by reference.

A planar type transistor may be formed in the peripheral region C. For example, the planar type transistor may include a gate insulation layer 130c and a gate electrode 145c on the gate insulation layer 130c on the peripheral region C. The planar type transistor may have a general MOS transistor structure.

In embodiments of the present invention, the fin type first isolation layer 110a in the cell region A may have a plurality of depressions, and the second isolation layers 110b and 110c in the boundary region B and the peripheral region C may be non-depressed regions. Thus it is possible to substantially prevent irregular depressions from occurring in the second isolation layer 110b having a comparatively wide width in the boundary region B. Also, a fin type memory transistor and a planar type memory transistor, which are separated from each other, may be respectively formed in the cell region A and the peripheral region C if needed.

Figure 4:
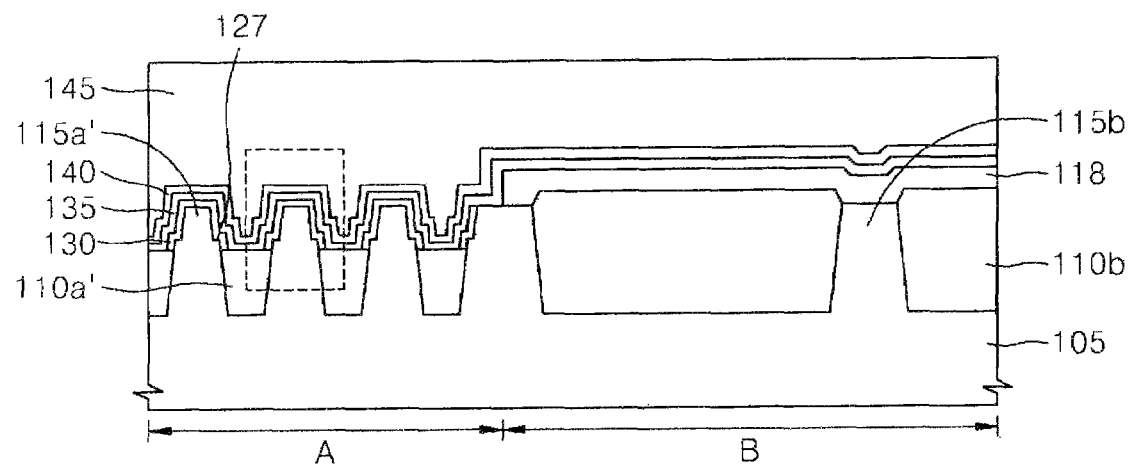
FIG. 4 is a cross-sectional view illustrating a non-volatile memory device according to another embodiment of the present invention.
Figure 5:
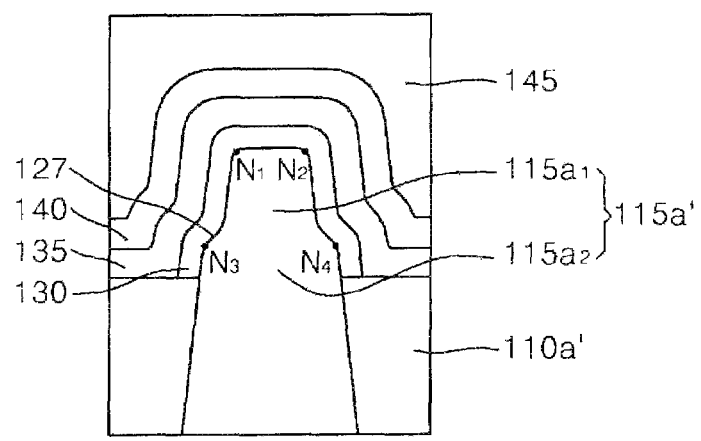
FIG. 5 is an enlarged, cross-sectional view of a portion of the non-volatile memory device of FIG. 4.

FIG. 4 is a cross-sectional view illustrating a non-volatile memory device according to another embodiment of the present invention. FIG. 5 is an enlarged cross-sectional view of a portion of the non-volatile memory device of FIG. 4. For example, FIG. 5 is a cross-sectional view of a portion, indicated with dots, of the non-volatile memory device of FIG. 4. The non-volatile memory device illustrated in FIG. 4 is a modification to that illustrated in FIGS. 1 through 3, in which only the structure of a first active region 115a' is modified. Therefore, the non-volatile memory device of FIG. 4 will be described with respect to the first active region 115a'.

Referring to FIGS. 4 and 5, at least one inflected portion 127, which may have a convex portion a concave portion, may be formed at least one of the sidewalls of the first active region 115a'. The first active region 115a' may be divided into an upper portion $115a_1$ and a lower portion $115a_2$ by the inflected portion 127. The curvature of the inflected portion 127 may be determined such that the width of the upper portion $115a_1$ is narrower than that of the lower portion $115a_2$. Therefore, the width of the first active region 115a' may be significantly changed starting from the inflected portion 127.

The inflected portion 127 may increase the rate of projecting corners of the first active region 115a'. Thus, middle corners $N_3$ and $N_4$ may further be formed in the first active region 115a' around the inflected portion 127, in addition to upper corners $N_1$ and $N_2$ of the first active region 115a'. The upper corners $N_1$ and $N_2$ may be formed to a square shape or a round shape. The corners $N_1$ through $N_4$ allow a current field to be concentrated in the first active region 115a' so as to increase electric density, thereby increasing the operating speed of the non-volatile memory device.

The inflected portion 127 may have a step shape as illustrated in FIG. 4, and the first active region 115a' may have squared corners around the inflected portion 127 accordingly. Also, as illustrated in FIG. 5, the inflected portion 127 may be formed to have an inclination, and the middle corners $N_3$ and $N_4$ of the first active region 115a' around the inflected portion 127 may have a round shape accordingly.

The inflected portion 127 may be formed at only one sidewall of the first active region 115a', but is preferably formed at both the sidewalls of the first active region 115a' such that the two inflected portions 127 are symmetrical with each other. Further, a plurality of inflected portions 127 may be arranged along the sidewalls of the first active region 115a'. In this case, the width of the first active region 115a' decreases from bottom to top, and more significantly decreases at the inflected portions 127.

The inflected portion 127 may be formed at a part of the first active region 115', which is exposed via the first isolation layer 110a'. The tunneling insulation layer 130, the storage node layer 135, the blocking insulation layer 140, and the control gate electrode 145 may be arranged to encompass the part of the first active region 115a', which is exposed via the first isolation layer 110a'. For example, the tunneling insulation layer 130 and the storage node layer 135 may be formed to cover the part of the first active region 115a', which is exposed via the first isolation layer 110a', that is, to cover the upper portion $115a_1$ and a portion of a lower portion $115a_2$.

The control gate electrode 145 may be formed at a location higher than the top of the inflected portion 127 so as to encompass the upper portion $115a_1$ of the first active region 115a'. For example, a sum of the thicknesses of the storage node layer 135 and the blocking insulation layer 140 on the first isolation layer 110a' may be greater than the distance between the first isolation layer 110a' and the inflected portion 127. Thus, it is possible to store more electric charges in a part of the storage node layer 135 on the upper corners $N_1$ and $N_2$ than in a part of the storage node layer on the middle corners $N_3$ and $N_4$ during a programming operation.

The above structure of the non-volatile memory device improves the retention capability thereof, since the electric charges stored in the part of the storage node layer 135 on the middle corners $N_3$ and $N_4$ can move to the side surfaces more easily than those stored in the part of the storage node layer 135 on the upper corners $N_1$ and $N_2$. Also, since a portion of the upper portion $115a_1$ of the first active region 115a' is used as a channel region, the width of the channel region is substantially reduced. As described above, a reduction in the width of the channel region may result in a reduction in the short-channel effect.

According to an embodiment of the present invention, the structure of the boundary region B is not limited to the illustration in FIG. 4. Furthers the structure of the peripheral region C may be determined based on FIG. 1 but is not limited thereto.

Figure 6:
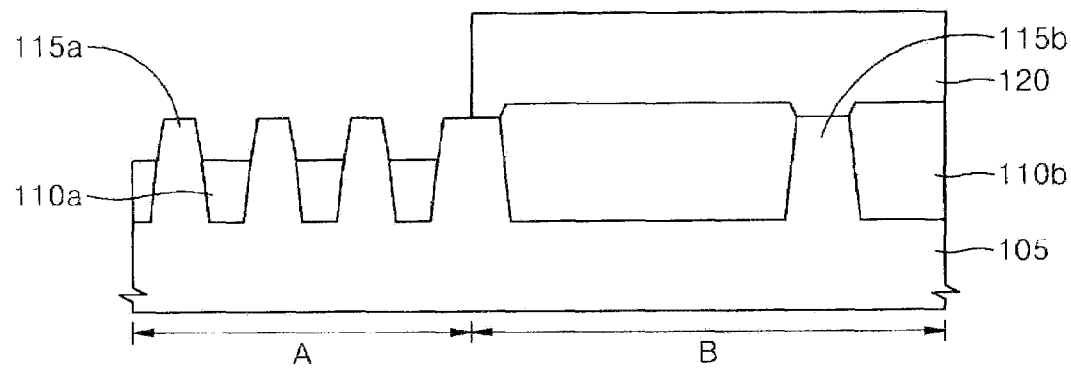
FIGS. 6 through 8 are cross-sectional views illustrating a method of fabricating a non-volatile memory device, according to embodiments of the present invention.
Figure 7:
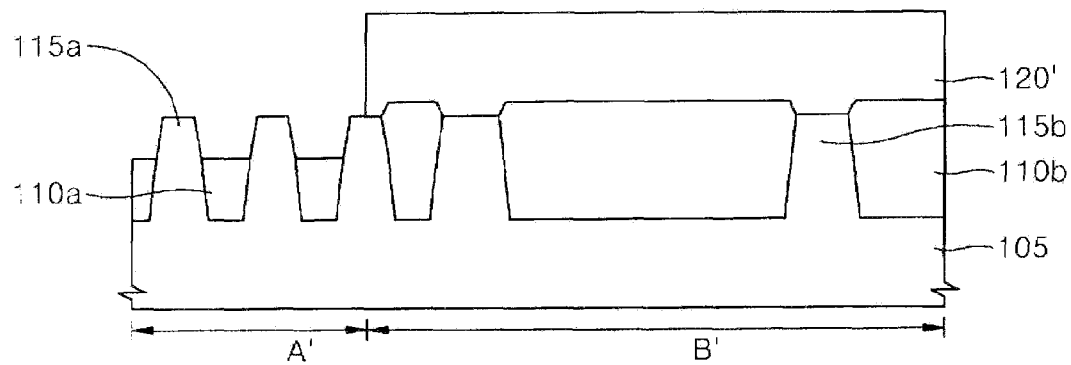
Figure 8:
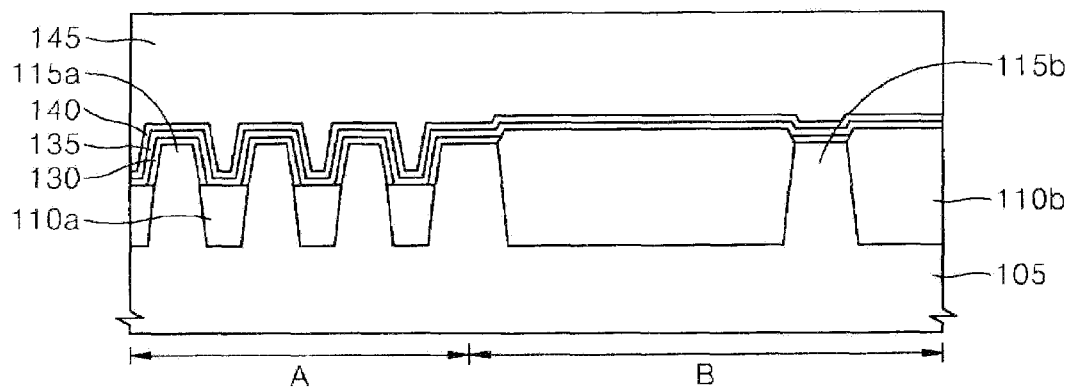

FIGS. 6 through 8 are cross-sectional views illustrating a method of fabricating a non-volatile memory device according to embodiments of the present invention.

Referring to FIG. 6, a semiconductor substrate 105 in which a plurality of regions are defined is prepared. For example, a cell region A may form a first region and a boundary region B may form a second region. The semiconductor substrate 105 may further have a peripheral region C as illustrated in FIG. 1. The cell region A may form the first region, and the boundary region B and the peripheral region C may form the second region.

A first isolation layer 110a with a plurality of depressions, each having a predetermined depth from an upper surface of the semiconductor substrate 105, is formed in the first regions such as the cell region A of the semiconductor substrate 105, thus defining a fin type first active region 115a in the first region. A second isolation layer 110b is formed in the second region, such as the boundary region B of the semiconductor substrate 105, thus defining a planar type second active region 115b in the second region.

More specifically, a trench insulation layer (not shown) is formed in the cell region A and the boundary region B of the semiconductor substrate 105. In this case, the trench insulation layer in the boundary region B may be defined as the second isolation layer 110b. An etch mask layer 120 exposing the cell region A is formed on the semiconductor substrate 105. For example, the etch mask layer 120 may be formed as a photoresist pattern.

The first isolation layer 110a with the plurality of depressions may be obtained by etching the trench insulation layer in the cell region A to a predetermined depth using the etch mask layer 120 as a protective layer. The trench insulation layer may be etched through isotropic etching such as wet etching.

As described above, in order to form the first isolation layer 110a having a narrow width, the second isolation layer 110b having a comparative width is not etched when etching the trench insulation layer. Therefore, it is possible to suppress a loading effect from occurring when the trench insulation layer is etched from both the cell region A and the boundary region B in order to substantially prevent irregular etching.

FIG. 7 illustrates a modification on a non-volatile memory device according to an embodiment of the present invention. Referring to FIG. 7, an etch mask layer 120' extends to a boundary of a cell region A' with a boundary region B'. In this case, a first region may be limited to the cell region A' which is narrower than the cell region A shown in FIG. 5, and a second region may be limited to both a boundary region B', which is wider than the boundary region B shown in FIG. 5.

Referring to FIG. 8, a tunneling insulation layer 130 is formed on the first active region 110a in the semiconductor substrate 105. The tunneling insulation layer 130 may further be formed on the second active region 110b in the boundary region B, not in a peripheral region C as illustrated in FIG. 3. The tunneling insulation layer 130 may be formed by thermally oxidizing the semiconductor substrate 105. Alternatively, the tunneling insulation layer 130 may be formed through chemical vapor deposition (CVD). When forming the tunneling insulation layer 130 through CVD, the tunneling insulation layer 130 may further be formed on the first isolation layer 110a.

A storage node layer 135 is formed on the tunneling insulation layer 130. The storage node layer 135 may be formed through CVD. The storage node layer 135 may be continuously formed on both the first isolation layer 110a in the cell region A and the second isolation layer 110b in the boundary region B. The storage node layer 135 may include polysilicon, a silicon nitride layer, metal dots, silicon dots, or a nano-crystal.

A blocking insulation layer 140 is formed on the storage node layer 135. The blocking insulation layer 140 may be formed through CVD. A control gate electrode 145 is formed on the blocking insulation layer 140. For example, the device is a NAND type the control gate electrode 145 may be formed while extending across the fin type first active region 115a and/or the planar type second active region 115b. Since the second isolation layer 110b is not depressed in the boundary region B, the control gate electrode 145 can be reliably formed without a large step.

A planar type transistor (not shown) may be formed in the peripheral region C illustrated in FIG. 1 concurrently with, before, or after the formation of the above memory transistor in the cell region A. The planar type transistor may be fabricated according to a method of forming a general MOS transistor.

As described above, according to a method of fabricating a non-volatile memory device, it is possible to economically fabricate different types of transistors in the cell region A and the boundary region B by using the semiconductor substrate 105 which is a bulk semiconductor substrate. In particular, a fin type transistor is not formed in the boundary region B and/or the peripheral region C, thereby substantially preventing the second isolation layer 110b from being irregularly etched in the boundary region B having a wide width.

Figure 9:
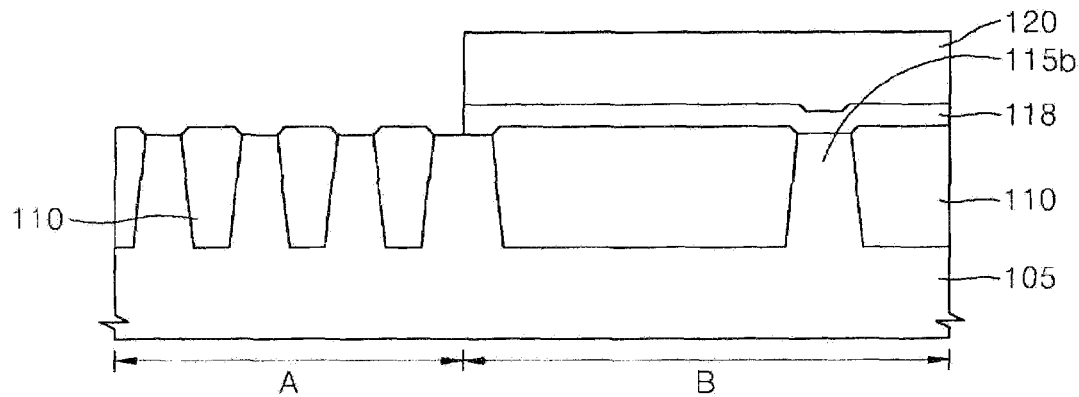
FIGS. 9 through 16 are cross-sectional views illustrating a method of fabricating a non-volatile memory device according to another embodiment of the present invention.

FIGS. 9 through 16 are cross-sectional views illustrating a method of fabricating a non-volatile memory device according to another embodiment of the present invention. Referring to FIG. 9, a semiconductor substrate 105 in which a cell region A, e.g., a first region, and a boundary region B, e.g., a second region, are defined, is prepared. The semiconductor substrate 105 has been described above with reference to FIG. 5.

A trench insulation layer 110 is formed in the cell region A and the boundary region B. Next, an oxidation barrier layer 118 and an etch mask layer 120 are sequentially formed on the boundary region B. For example, the oxidation barrier layer 118 may contain a material, e.g., a silicon nitride layer, which substantially prevents the barrier region B from being oxidized.

Figure 10:
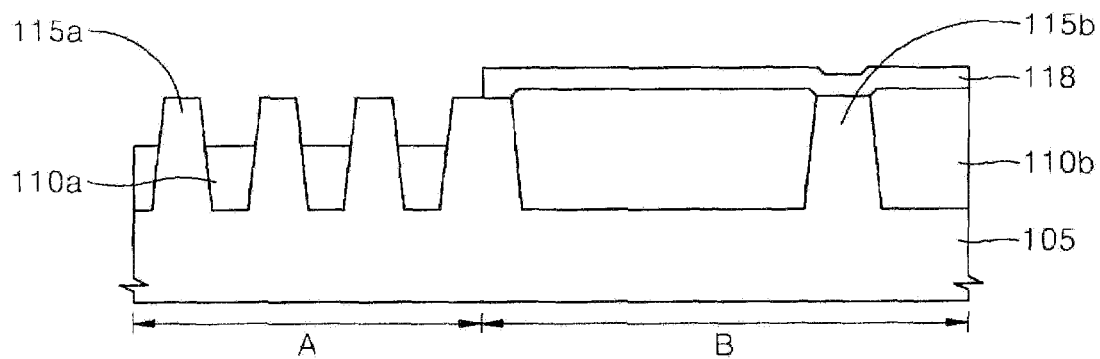

Referring to FIG. 10, a first isolation layer 110a with a plurality of depressions may be formed by etching the trench insulation layer 110 illustrated in FIG. 8 in the cell region A to a predetermined depth by using the oxidation barrier layer 118 and/or the etch mask layer 120 as a protective layer. The trench insulation layer 110 may be etched through isotropic etching such as wet etching. The trench insulation layer 110 in the boundary region B may be defined as a second isolation layer 110b without being changed.

Figure 11:
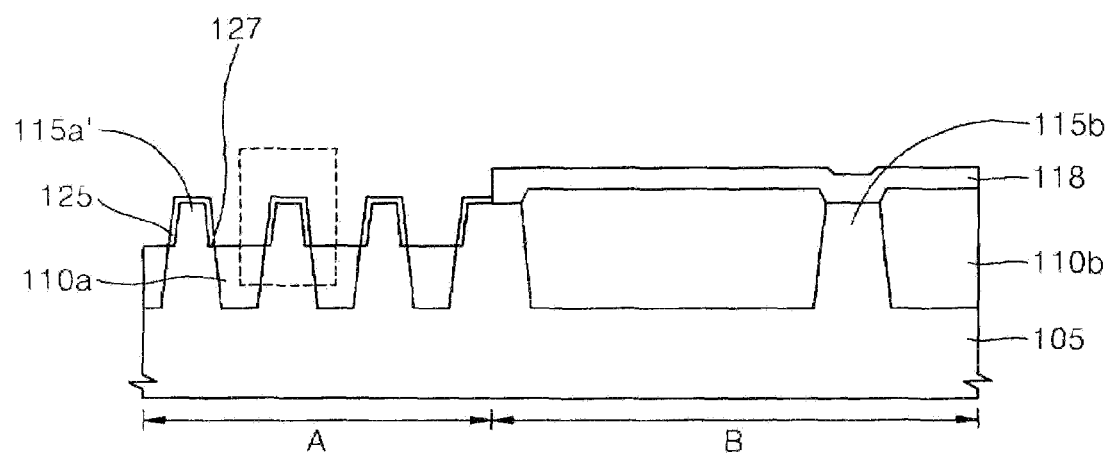
Figure 12:
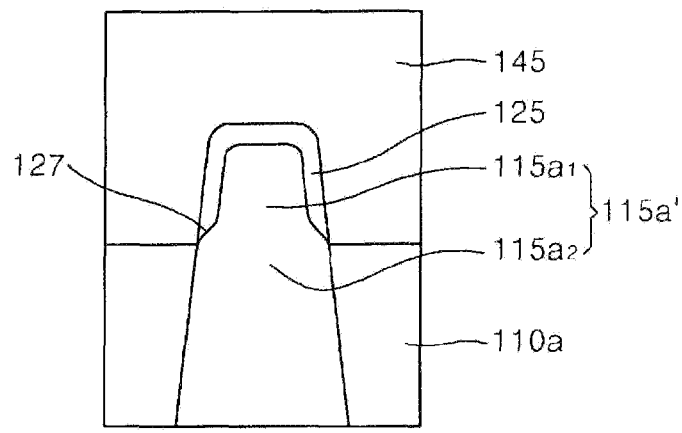

Referring to FIGS. 11 and 12, a sacrificial oxide layer 125 is formed by selectively oxidizing a surface of a first active region 115a, of FIG. 10, which is exposed via the first isolation layer 110a by using the oxidation barrier layer 118 as a protective layer. Thus, the resultant first active region 115a' has at least one inflected portion 127, and thus, the width of upper portion 115a, of the resultant first active region 115a' is narrower than the width of the lower portion $115a_2$ thereof. For example, the sacrificial oxide layer 125 may be selectively formed only on a surface of the semiconductor substrate 105 through thermal oxidation.

Figure 13:
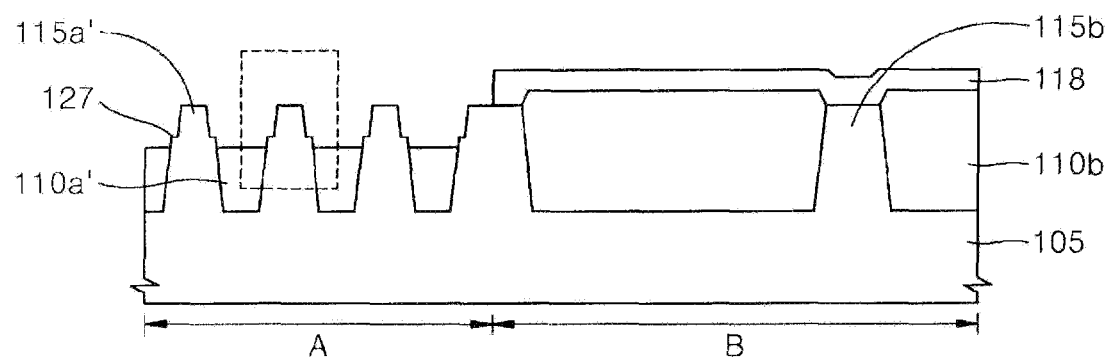
Figure 14:
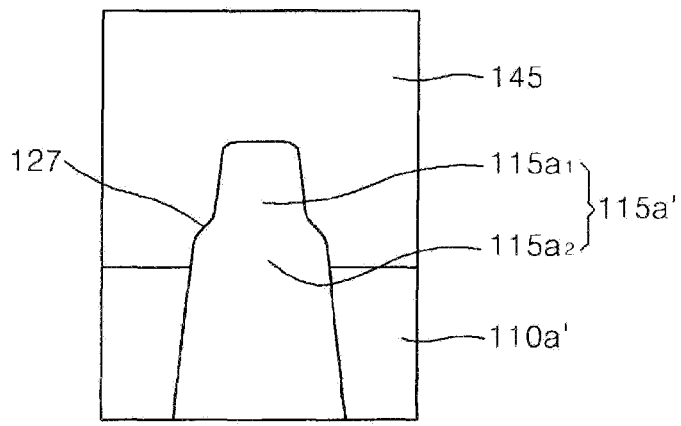

Referring to FIGS. 13 and 14, the sacrificial oxide layer 125 illustrated in FIG. 10 is removed using the oxidation barrier layer 118 so as to expose the resultant first active region 115a' from the remnant first isolation layer 110a'. In this case, the top of the first isolation layer 110a may be etched together with the sacrificial oxide layer 125, and thus, the remnant first isolation layer 110a' may be lower than the first isolation layer 110 illustrated in FIGS. 11 and 12.

Figure 15:
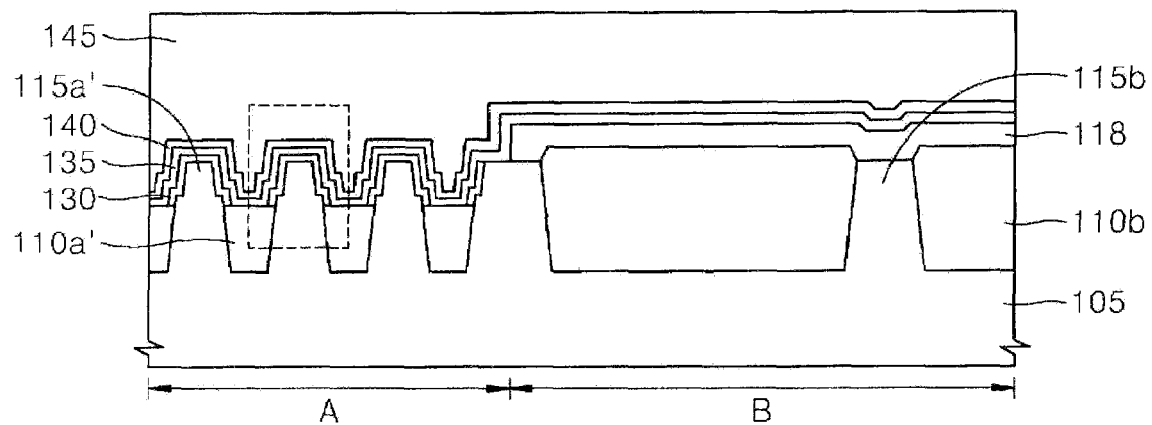
Figure 16:
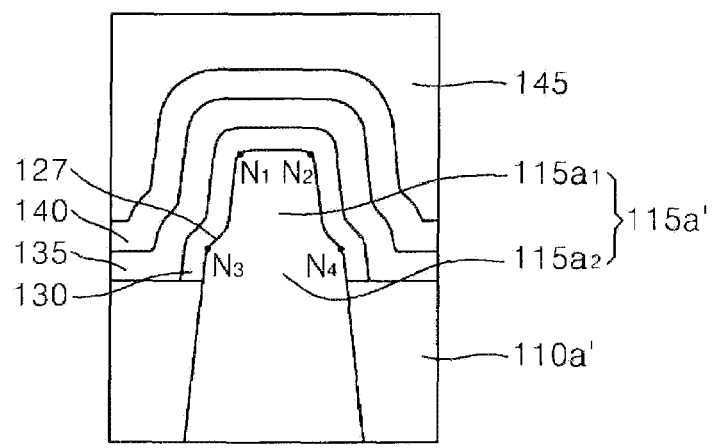

Referring to FIGS. 15 and 16, a tunneling insulation layer 130, a storage node layer 135, a blocking insulation layer 140, and a control gate electrode 145 are sequentially formed on the resultant first active region 115a'. The tunneling insulation layer 130 and the storage node layer 135 may be formed to encompass a part of the lower portion $115a_2$ and the upper portion $115a_1$ of the resultant first active region 115a'. The control gate electrode 145 may be formed at a location higher than the inflected portion 127 so as to encompass the upper portion $115a_1$ of the resultant first active region 115a'.

A planar type transistor (not shown) may further be formed on a peripheral region C illustrated in FIG. 1 concurrently with, before, or after the formation of the above memory transistor in the cell region A.

According to a method of fabricating a non-volatile memory device according to another embodiment of the present invention it is possible to economically control the width of the fin type first active region 115a' to be narrower than in a non-volatile memory device without performing a photolithography method. A reduction in the width of the first active region 115a' reduces or suppresses the short-channel effect occurring in a fin type memory transistor.

What is claimed is:

1. A non-volatile memory device comprising:
a first isolation layer formed with a plurality of depressions in a semiconductor substrate, where the depressions have a predetermined depth from an upper surface of the semiconductor substrate;
a fin type first active region defined by the first isolation layer and having one or more inflected portions at its side walls exposed from the first isolation layer, where the first active region is divided into an upper portion and a lower portion by the inflected portions and a width of the upper portion is narrower than a width of the lower portion;
a tunneling insulation layer formed on the first active region;
a storage node layer formed on the tunneling insulation layer;
a blocking insulation layer formed on the storage node layer; and
a control gate electrode formed on the blocking insulation layer,
wherein the inflected portion comprises a convex portion and a concave portion and wherein a top surface of the fin type active region is positioned above a top surface of the first isolation layer in the depressions.

2. The non-volatile memory device of claim 1, wherein the inflected portions are formed at both the sidewalls of the first active region as to be symmetrical with each other.

3. The non-volatile memory device of claim 1, wherein the control gate electrode is formed to encompass the upper portion of the first active region, and does not extend to a depth of the lower portion.

4. The non-volatile memory device of claim 3, wherein the tunneling insulating layer is formed to encompass a surface of the first active region, which is exposed from the first isolation layer.

5. The non-volatile memory device of claim 3, wherein the storage node layer is formed to encompass the upper portion of the first active regions and a portion of the lower portion of the first active region which is exposed from the first isolation layer.

6. The non-volatile memory device of claim 1, wherein the storage node layer comprises one of polysilicon, a silicon nitride layer, metal dots, silicon dots, and a nano-crystal.

7. A non-volatile memory device comprising:
a semiconductor substrate in which a first region and a second region are defined;
a first isolation layer formed with in a plurality of depressions in the first region of the semiconductor substrate so as to define a fin type first active region, where the depressions have a predetermined depth from an upper surface of the first region;
a second isolation layer formed in the second region in order to define a planar type second active region;
a tunneling insulation layer formed on the fin type first active region of the semiconductor substrate;
a storage node layer formed on the tunneling insulation layer;
a blocking insulation layer formed on the storage node layer; and
a control gate electrode formed on the blocking insulation layer,
wherein a top surface of the fin type active region is positioned above a top surface of the first isolation layer in the depressions, and
wherein a top surface of the planar type second active region is positioned at or below a top surface of the second isolation layer.

8. The non-volatile memory device of claim 7, further comprising a planar type transistor formed in the planar type second active region on the semiconductor substrate.

9. The non-volatile memory device of claim 7, wherein the fin type first region comprises a cell region, and the second region comprises a peripheral region.

10. The non-volatile memory device of claim 9, wherein the second region further comprises a boundary region between the cell region and the peripheral region.

11. The non-volatile memory device of claim 7, wherein the first active region comprises one or more inflected portions at its sidewalls, where the first active region is divided into an upper portion and a lower portion by the inflected portions and a width of the upper portion is narrower than a width of the lower portion and wherein the inflected portion comprises a convex portion and a concave portion.

12. The non-volatile memory device of claim 11, wherein the inflected portions are formed at both the sidewalls of the first active region so as to be symmetrical with each other.

13. The non-volatile memory device of claim 7, wherein the storage node layer comprises one of polysilicon, a silicon nitride layer, metal dots, silicon dots, and a nano-crystal.

14. The non-volatile memory device of claim 1, wherein the fin type first active region and the semiconductor substrate are formed of a same material.

15. The non-volatile memory device of claim 14, wherein the semiconductor substrate directly contacts the fin type first active region.

16. A non-volatile memory device comprising:
a lower portion protruding from a semiconductor substrate;
an upper portion protruding from the lower portion and having a narrower width than a width of the lower portion; and
an isolation layer covering a semiconductor substrate and a first sidewall of the lower portion,
wherein the semiconductor substrate, the lower portion and the upper portion are made of same material.

17. The non-volatile memory device of claim 16, further comprising:
- a tunneling insulation layer covering a second sidewall of the lower portion and the upper portion;
- a storage node layer on the tunneling insulation layer;
- a blocking insulation layer formed on the storage node layer; and
- a control gate electrode formed on the blocking insulation layer.

18. The non-volatile memory device of claim 16, wherein the lower portion includes a squared corner and the upper portion includes a squared corner.

19. The non-volatile memory device of claim 17, wherein at least one of the squared corners of the lower portion and the upper portion is chamfered.

* * * * *